United States Patent [19]

Buchwalter et al.

[11] Patent Number: 5,340,451
[45] Date of Patent: Aug. 23, 1994

[54] PROCESS FOR PRODUCING A METAL ORGANIC POLYMER COMBINATION

[75] Inventors: Leena P. Buchwalter; Stephen L. Buchwalter, both of Wappingers Falls; Charles R. Davis, Endicott; Ronald D. Goldblatt, Rye Brook; John E. Heidenreich, III, Yorktown Heights; Sharon L. Nunes, Hopewell Junction; Jae M. Park, Somers; Richard R. Thomas, Fishkill; Domenico Tortorella, Yonkers; Luis M. Ferreiro, deceased, late of Bartonia, all of N.Y., by Mitchell Annette, Legal Representative

[73] Assignee: International Business Machines Corporation, Armonk, N.Y.

[21] Appl. No.: 61,815

[22] Filed: May 13, 1993

Related U.S. Application Data

[63] Continuation of Ser. No. 917,802, Jul. 20, 1992, abandoned, which is a continuation of Ser. No. 592,754, Oct. 4, 1990, abandoned.

[51] Int. Cl.⁵ ............................................. B01D 3/00
[52] U.S. Cl. .................................. 204/165; 204/169; 427/490; 427/536; 427/539
[58] Field of Search ............... 427/536, 539, 490; 204/169, 164, 165

[56] References Cited

U.S. PATENT DOCUMENTS

| | | | |
|---|---|---|---|
| 3,954,570 | 5/1976 | Shirk et al. | 205/118 |
| 4,072,769 | 2/1978 | Lidel | 204/165 |
| 4,165,394 | 8/1979 | Ehrbar et al. | 427/40 |
| 4,337,279 | 6/1982 | Polak | 427/40 |
| 4,382,101 | 5/1983 | Polak | 427/537 |
| 4,422,907 | 12/1983 | Birkmaier et al. | 427/40 |
| 4,445,991 | 5/1984 | Arbit | 204/165 |
| 4,548,867 | 10/1985 | Ueno et al. | 428/409 |
| 4,584,867 | 4/1986 | Forster | 73/25.03 |
| 4,731,156 | 3/1988 | Montmarquet | 156/643 |
| 4,765,860 | 8/1988 | Ueno et al. | 156/272.6 |
| 4,946,903 | 8/1990 | Gardella, Jr. et al. | 525/326.4 |
| 5,019,210 | 5/1991 | Chou et al. | 204/192.36 |

FOREIGN PATENT DOCUMENTS 0268821  6/1988  European Pat. Off.
0374487  6/1990  European Pat. Off.

Primary Examiner—John Niebling
Assistant Examiner—Brendan Mee
Attorney, Agent, or Firm—Scully, Scott, Murphy & Presser

[57] ABSTRACT

A process is disclosed for producing a metal-organic polymer combination by contacting the polymer with a plasma followed by an aqueous solution of a metal salt. In one embodiment a water or nitrous oxide plasma is used to treat a polyimide or a fluorinated polymer. The polymer is combined with a metal cation, the metal being a catalyst for a conventional electroless coating after which it is contacted with an electroless metal plating bath for the formation of electrical circuits and especially for plating high aspect ratio vias in microcircuits. Unlike the conventional electroless process, the cationic catalytic metal is not reduced to a zero valent metal catalyst prior to the application of the electroless metal coating solution.

The process also improves the wettability of the polymer, especially the fluorinated polymer and is especially useful in improving the wettability of high aspect ratio vias.

35 Claims, 1 Drawing Sheet

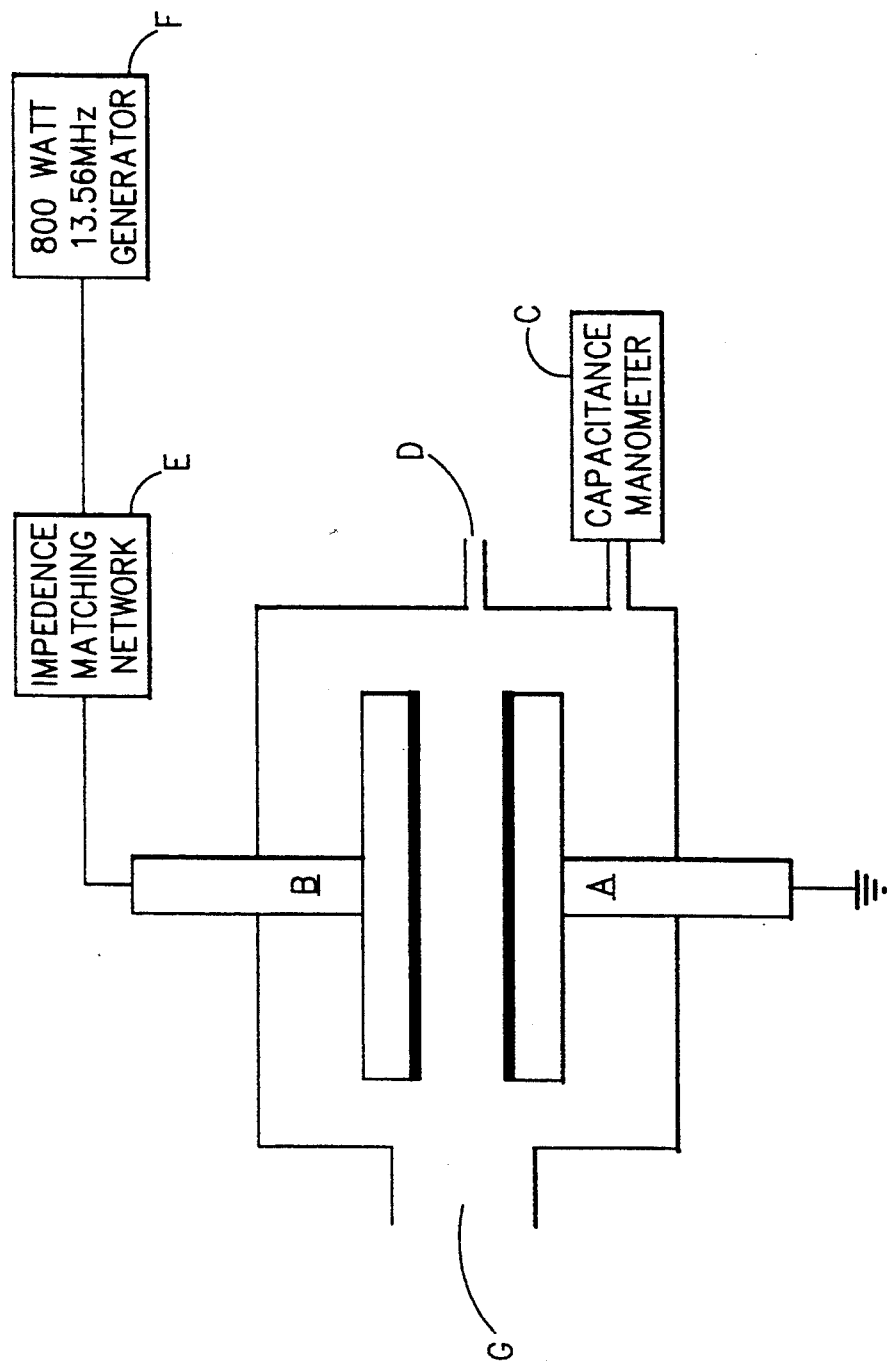

PROCESS FOR PRODUCING A METAL ORGANIC POLYMER COMBINATION

This is a continuation of copending application(s) Ser. No. 917,802 filed on Jul. 20, 1992 now abandoned, which was a continuation of application Ser. No. 592,754 now abandoned, filed Oct. 4, 1990.

DESCRIPTION

1. Technical Field

The technical field of the invention is surface functionalization of a polymer in a plasma to render it susceptible to seeding in a aqueous palladium salt solution without a supplemental sensitizer. When the polymer is functionalized in a plasma and combined with an aqueous palladium salt solution the combination can be employed for the formation of an electroless metal coating using art known electroless coating baths. The electroless metal coating obtained has good adhesion to the polymer.

Additionally, the invention is directed to surface functionalization of a polymer in a plasma in order to improve its wettability.

2. Prior Art

Ehrbar, et al. U.S. Pat. No. 4,165,394 disclose a method for pretreating a plastic substrate prior to conventional electroless metal deposition with a corona discharge followed by the application of a reducing solution and then an activation bath containing $Sn^{+2}$ and $Pd^{+2}$ ions as well as a suspension of colloidal Pd. The surface contacted with the activation bath is immersed in an acceleration bath followed by the application of electroless copper.

The activation bath containing the $Sn^{+2}$ and $Pd^{+2}$ ions is a standard catalyst employed in the deposition of electroless copper, the $Sn^{+2}$ ions being used to reduce the $Pd^{+2}$ ions to form colloidal Pd, the latter acting as a catalyst in the subsequent electroless copper deposition process. It has been theorized that the $Sn+2$ ions also form a protective layer around the colloidal Pd which have to be removed in order to expose the surface of the Pd so that it will be more readily available to effectively catalyze the subsequent electroless metal deposition. Without the protective coating afforded by the $Sn^{+2}$ ions the colloidal Pd would be precipitated from the suspension which would present a problem in applying the catalyst evenly and uniformly to a surface that is to be subsequently plated by the electroless process.

The acceleration bath employed by Ehrbar, et al. removes the protective layer of $Sn^{+2}$ ions around the colloidal particles of Pd thereby making the latter available to catalyze the subsequent electroless metal coating.

In order to complete the Ehrbar et al. process, the surface having the Pd particles on it is contacted with a conventional aqueous electroless copper coating solution. The electroless copper coating solution contains an aldehyde reducing agent such as formaldehyde which, in the presence of Pd, reduces $Cu^{+2}$ ions in the electroless copper solution to copper metal. The copper metal plates out on the surface of the plastic and may have subsequent metal coatings applied to it by electrolytic means.

Shirk et al. U.S. Pat. No. 3,954,570 describes a process for preparing an activated or sensitized polyimide polymer by contacting the surface of the polyimide with a flame followed by the application of an electroless metal catalyst such as $PdCl_2$, $AgNO_3$ or $AuCl$. Shirk et al. note (column 4 lines 1-6) that $PdCl_2$ is the preferred catalyst as the flame sensitized film does not require the supplemental sensitizer (i.e. $SnCl_2$) which may be needed with other catalysts in the electroless metal deposition process.

Birkmaier et al. U.S. Pat. No. 4,422,907 describes a process for treating the surface of natural and synthetic plastic materials by ozone, thereafter applying a solution of a strong base in water or a polar organic solvent followed by the application of a conventional electroless plating coating.

Ueno et al. U.S. Pat. Nos. 4,765,860 and 4,584,867; Polak U.S. Pat. Nos. 4,337,279 and 4,382,101 and Lidel U.S. Pat. No. 4,072,769 teach exposing a polymeric surface to a plasma in order to obtain better adhesive bonding of either a metal foil or gelatin-containing photosensitive layer.

The formation of microcircuits in some instances requires metal plating of high aspect ratio vias i.e. those that are more narrow than deep, which include through vias or blind vias. Blind vias are more difficult to plate. The latter are formed for example, by placing a polymer layer over a metal layer and then forming a trench in the polymer layer extending downward to the metal layer. The aspect ratio is defined as the ratio of the height of the trench to the width of the trench in the polymer layer. A high aspect ratio therefore signifies that the width of the trench is very narrow compared to the thickness of the polymer layer. The plating is used to establish an electrical contact in the via. When the via is a blind via formed in a polymer to a metal substrate, the plating is used to establish electrical contact with the metal substrate. The trench is generally formed by an etching process and under ideal conditions the spacing between the walls of the trench from the bottom to the top would be about equal i.e. the walls of the trench would be substantially parallel to one another. If in practice the trench narrows as it extends from the surface of the polymer layer towards the metal layer, it becomes extremely more difficult to wet. Most water solutions of metal salts have more of a tendency to bridge the trench rather than wet the walls thereof. Accordingly, it is difficult to form electrical contacts by plating high aspect ratio vias by means of conventional aqueous electroless metal plating methods.

It is therefore an object of the present invention to overcome these and other difficulties or disadvantages of the prior art.

It is a further object of the present invention to provide a process for applying a metal coating to a nonconductive surface.

It is a further object of the present invention to functionalize a polymer and subsequently contact the polymer thus obtained with a compound containing cations of a metal so that the cations are combined with the polymer for direct treatment with a conventional electroless plating bath and thereby eliminate the sensitizing process step required in conventional electroless plating.

It is a further object of the invention to provide such functionalization of the polymer by contacting the polymer with a plasma.

It is also an object of the present invention to provide a metal organic polymer combination on the surface of the polymer.

It is the further object of the present invention to provide a metal-organic polymer combination at the surface of the polymer extending to a depth beneath the surface of the polymer.

It is a further object of the invention to provide a novel method for the improved wetting of a polymer and especially high aspect ratio blind vias by water or water solutions of compounds such as metal salts and the like.

It is a further object of the invention to provide a novel method for seeding polymers and especially high aspect ratio blind vias with an aqueous solution of a metal salt.

These and other objects have been achieved according to the present invention which will become apparent by reference to the written description of the invention and claims that follow.

SUMMARY OF THE INVENTION

The present invention resides in the discovery that a plasma can be used to functionalize the surface of a polymer. The functionalized surface can be used to combine with metal salts. The functionalized polymer can be employed in processes such as an electroless coating process whereby ionic species of a catalyst employed in an electroless process can be combined with the polymer surface that has been treated by a plasma. A conventional aqueous electroless coating containing a copper salt can then be brought into contact with the treated polymer and the copper salt reduced to copper metal directly. The invention differs from the conventional electroless processes in that the ionic species of the catalyst previously had to be reduced to a metal such as in the case of palladium salts which were reduced to palladium metal by stannous tin. As noted previously herein, the palladium in turn catalyzes the reduction of the electroless solution which conventionally contained a metal salt such as a copper salt in combination with a reducing agent such as an aldehyde. Although the inventors do not wish to be limited by any theory, it is believed that a complex is formed between the functionalized polymer surface and the catalyst salt and when brought into contact with a conventional electroless coating containing a reducing agent, the catalyst salt is reduced by the reducing agent in the electroless coating to a catalyst metal and the catalyst metal then promotes the catalytic reduction of the electroless metal salt to a metal coating.

BRIEF DESCRIPTION OF THE DRAWING

The plasma system for producing a water vapor plasma (shown in the Figure) consists of a stainless steel vacuum chamber with parallel plate electrodes. Prior to processing, the chamber is evacuated to a base pressure in the $10^{-7}$ Torr range using a 500 l/sec. turbomolecular pump. The plasma is generated between a grounded electrode (A) and an RF powered electrode (B) attached to an 800 Watt, 13.56 MHz generator (F), through an automatic impedance matching network (E). The electrodes are 10 inches in diameter and separated by 5 inches. During typical operation, 50 Watts of RF power is applied to the system. Samples are placed on the grounded electrode (A), and both electrodes have graphite cover plates. During processing the system is pumped using a 30 cmh mechanical pump, and the pressure monitored with a capacitance manometer (C). Plasma supporting gas e.g. water-vapor is introduced into the chamber at point (D) using a heated liquid source (50°–100° C.) and a condensable vapor mass flow controller. All vapor transfer lines approaching the chamber are maintained at 100° C., and a refrigerated recirculator used to maintain both electrodes at 25° C.

DETAILED DESCRIPTION OF THE INVENTION

The present invention broadly relates to a process for producing a metal-organic polymer combination wherein the metal is either formed on the surface of the organic polymer or intermixed with the organic polymer starting at the surface of the organic polymer and extending to a depth beneath the surface depending on the various processing conditions and materials employed.

It has been found according to the present invention that a polymer can be functionalized by means of a plasma to render it susceptible to seeding in an aqueous metal salt solution whereby the metal salt is combined with the polymer thus treated. Although the inventors do not wish to be limited by any theory, it is believed that the polymer thus treated and the metal salt combined with one another by the formation of a complex of the two. The polymers functionalized by the plasma treatment of the present invention have also been found to have improved wetting by water or water solutions of compounds such as metal salts and the like. The polymer that has been treated by the plasma according to the present invention in order to functionalize the polymer will be described herein after as a treated polymer.

The plasma employed in the present invention is a typical plasma containing ionized gases consisting of equal numbers of positive and negative particles, a variety of neutral species including atoms, metastables, molecules, free radicals and photons.

In one embodiment the plasma supporting gas comprises an oxidizing agent having oxygen such as water, peroxides, oxygen, the oxides of nitrogen such as nitrous oxide, and ozone.

The plasma supporting gas may also comprise a hydrogen containing reducing species such as hydrogen, water, various peroxides described herein, $NH_3$, $H_2S$, hydrazine compounds comprising hydrazine as well as substituted hydrazines. Mixtures of the gas or gases comprising an oxidizing agent with a gas or gases comprising a hydrogen containing reducing species can also be employed.

The polymers that are employed according to the present invention comprises fluorinated ethylene polymers or polyimide type polymers both of which are known in the art.

The fluorinated ethylene polymers include the various Teflon (trademark) polymers, including polytetrafluoroethylene (PTFE), fluorinated ethylene-propylene copolymers including copolymers of tetrafluorethylene (TFE) and hexafluorpropylene (HFP); the fluorinated ethylene-propylene copolymers sometimes referred to as FEP copolymers; copolymers of ethylene and tetrafluoroethylene (ETFE); tetrafluoroethylene copolymers with perfluorovinyl ethers produced by the copolymerization of TFE with a perflurovinyl ether to produce a PTFE polymer having a perfluoroalkoxy (PFA) side chain; polychlorotrifluoroethylene; polybromotrifluoroethylene; poly(vinylfluoride); poly(vinylidenefluoride); poly(fluorosilicones) and the like which are further described in Kirk-Othmer *Encyclopedia of*

*Chemical Technology,* Third Edition Vol. 11 pp. 1–81 including the various references set forth therein incorporated herein by reference.

The various polyimides that may be employed as the polymer according to the present invention comprise those that are characterized by the presence of the phthalimide structure in the polymer backbone and are conventionally synthesized from dianhydrides and diamines to form poly(amic-acid)s which are thermally or chemically cyclized to the polyimide. The intermediate polyamic acid is generally soluble whereas the cyclized polyimide is insoluble. Conventional dianhydrides employed in this respect comprise pyromellitic dianhydride (PMDA) or benzophenonetetracarboxylic dianhydride (BTDA) whereas typical diamines comprises meta-or para-dianiline or 4,4'-diamino-diphenyl ether; 4,4'-diamino-diphenyl propane; 4,4'-diaminodiphenylmethane; 4,4'-diaminodiphenylether (ODA) and the like.

The various polyimides that may be employed according to the invention are disclosed and described further in Edwards, U.S. Pat. No. 3,179,614; Lindsey U.S. Pat. No. 3,361,589, Dunphy et al. U.S. Pat. No. 3,770,573 and the various United States Patents cited therein; and Kirk-Othmer, *Encyclopedia of Chemical Technology,* Third Edition, Vol. 18 pp. 704–719 and the various references cited therein all of which are incorporated herein by reference.

Other polymers that may be employed comprise poly(amides), poly(esters), poly(urethanes), poly(siloxanes), phenolics, poly(sulfides), poly(acetals), poly(ethylenes), polyisobutylenes), poly(acrylonitriles), poly(vinylchlorides), poly(styrenes), polylepoxides), poly(methylmethacrylates), poly(vinylacetates), poly(isoprenes), poly(carbonates), poly(ethers),poly(dienes), poly(alkenes), poly(acrylics), poly(methacrylics), poly(vinyl ethers), (poly(vinyl thioethers), poly(vinyl alcohol), poly(vinyl ketones), poly(vinyl halides), poly(vinyl nitriles), poly(vinyl esters), poly(phenylenes), poly(alkylene oxides), poly(anhydrides), poly(sulfonates), nitroso-polymers, poly(thioesters), poly(sulfones), poly(sulfonamides), poly(amides), poly(imines), poly(ureas), poly(phosphazenes), poly(silanes), poly(silazanes), poly(furan tetracarboxylic acid diimides), poly(benzimidazoles), poly(benzoxazoles), poly(benzothiazoles), poly(oxadiazoles), poly(triazoles), poly(quinoxalines), poly(immidazopyrrolones), poly(benzoxazoles), poly(oxadiazoles), poly(benzothiazinophenothiazines), poly(benzothiazoles), poly(pyrazinoquinoxalines), poly(pyromellitimides), poly(quinoxalines), poly(benzimidazoles), poly(oxindoles), poly(oxoisoindolines), poly(dioxoisoindolines), poly(triazines), poly(pyridazines), poly(piperazines), poly(pyridines), poly(piperidenes), poly(triazoles), poly(pyrazoles), poly(pyrrolidines), poly(carboranes), poly(fluoresceins), poly(oxabicyclononanes), poly(dibenzofurans), poly(phthalides), poly(anhydrides).

Without wishing to be limited by any theory, it is believed that oxygen containing surface functionalities are generated on the polyimide polymer including the so-called catechols, hydroxyl groups, carboxylic acid groups, carbonyl groups and possibly peroxides or ester groups, where the plasma supporting gas is an oxidizing gas.

When the polymer comprises perfluoro polymers or per halo-fluoro polymers and the plasma supporting gas comprises an oxidizing gas, it is believed that oxygen containing reactive species are produced on the polymer. Although not wishing to be limited by any theory, it is believed that these reactive species may be free radicals. The polymers obtained from this type of plasma treatment have to be subsequently protonated in order to functionalize them according to the object of the present invention. Protonation can be effected either by immersing polymers obtained according to this aspect of the invention in water or by subsequently contacting them with a plasma containing a reducing species or mixtures of reducing species and an oxidizing agent as described herein. Alternately the aforesaid polymer containing free radicals may be contacted with a metal compound and especially a compound based on a metal (e.g. sodium) lower in the electro chemical series of elements than the cationic species subsequently used for combining with the treated polymer such as for example palladium and the like.

The plasma is generated utilizing plasma generating devices that are well known in the art. Such a device is illustrated in the Figure included herewith. The plasma generating devices that may be employed according to the present invention may be operated at a frequency from about 50 KHz to 10 GHz but especially at a frequency of 13.56 MHz, the latter being employed because of federal regulations since electro magnetic radiation is also employed for radio communication.

The plasma is also generated at a pressure of from about $10^{-8}$ T to about 5 atmospheres of pressure especially from about 50 mT to about 300 mT.

The apparatus employed for generating the plasma comprises electrodes placed either inside or outside of a plasma chamber which are connected to a power generator either by capacity coupling or by inductive coupling. The electrodes may be shaped as plates, rings, rods, cylinders or various art known equivalents thereof and may be in the same form or in a different form from one another. A conventional disposition of the electrodes is one in which the inner walls of the plasma chamber are made of a metal to serve as one of the electrodes which is usually electrically grounded and the other electrode is installed inside of the plasma chamber as electrically insulated from the chamber walls with an insulating coating on the surface thereof with an insulating material having a considerably high dielectric strength in order to maintain a stable electric glow discharge for generating the plasma. When higher voltages are applied in such a chamber, an arc discharge will occur between the two electrodes which also generates a plasma, however, at substantially higher temperatures. The density of power consumption on the surface of the power electrode may be anywhere from about $10^{-3}$ watts per $cm^2$ to 1000 watts per $cm^2$ a conventional operating wattage being about 100 watts RF.

A specially selected gas is used for supporting the plasma discharge and is maintained in the plasma chamber as a flowing gas at below atmospheric pressure. In the preferred embodiment of the invention the plasma-supporting gas is flowed through the plasma chamber at a rate up to about 10 liters per minute and especially from about 0.01 to about 1000 SCCM (standard cc's per minute of plasma supporting gas where the volume of gas is measured at standard temperature and pressure i.e. STP). In use, the plasma supporting gas is flowed through the plasma chamber at one SCCM.

Although in the preferred embodiment the polymer is functionalized by exposing it to a plasma as described herein, functionalzation may also be effected by other methods including ion beam milling or reactive ion etching and techniques of this sort which are further described by Chapman, *Glow Discharge Processes, Sputtering and Plasma Etching,* 1980, John Wiley & sons, Inc. which is incorporated herein by reference. polymers obtained from these processes are also included within the group of treated polymers obtained according to the present invention.

As noted previously, the plasma supporting gas may comprise an oxidizing agent having oxygen such as water, oxygen, the oxides of nitrogen such as nitrous oxide, ozone, hydrogen peroxide and other peroxides. Those inorganic and organic peroxides that are suitable in this respect include those that exhibit some vapor pressure in the apparatus employed for functionalizing the polymer surface at the conditions employed in such apparatus. These peroxides include any of those generally and specifically listed as follows that have this characteristic.

| | |
|---|---|
| hydroperoxides (e.g. methylhydroperoxide, cyclohexylhydroperoxide etc.) | alpha-oxy and alpha-peroxy-hydroperoxides (e.g. hydroperoxymethanol, dioxydibis methanol etc.) |
| dialkyl peroxides (e.g. dimethylperoxide etc.) | peroxy acids (e.g. performic and peracetic acid etc.) |
| peroxyesters (e.g. t-butyl peroxyformate, t-amyl peracetate, t-butyl peroxybezenesulfonate etc.) | |

Other peroxides that may be suitable in this respect (i.e. those having suitable vapor pressures in the apparatus employed according to the invention) are set forth in Kirk-Othmer, *Encyclopedia of Chemical Technology,* 3rd Ed. Vol. 17 pp. 1–90 which is incorporated herein by reference.

The plasma supporting gas comprising substituted hydrazines that may be used according to the invention has the formula:

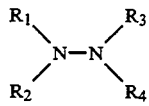

where R1 is alkyl, cycloalkyl, aryl, alkaryl, aralkyl, alkoxy, aryloxy or nitrogen containing heterocyclic radical and R2, R3 and R4 are hydrogen or the same as R1, and at least one of $R_1$, $R_2$, $R_3$, $R_4$ is hydrogen, said alkyl radicals including the alkyl portion of the alkaryl radical, cycloalkyl and aralkyl and alkoxy radicals containing from one to about ten carbon atoms including the isomeric configurations thereof, the ring structure of said cycloalkyl, aryl, alkaryl, aralkyl, aryloxy and heterocyclic radicals containing from 3 to about 17 carbon atoms including fused ring structures.

The various hydrazines and hydrazine compounds that may be employed in this respect are further defined in Kirk-Othmer (supra) Volume 12 pp. 734–771 which is incorporated herein by reference.

Additionally, the plasma supporting gas having hydrogen containing reducing species include diborane, metal acetylacetonates, lower alkyl metal complexes and lower n-alkanes. Lower alkyl compounds and alkanes comprise those having from one to about ten carbon atoms and the various isomeric configurations thereof.

The plasma supporting gas based on an oxidizing agent containing oxygen, the reducing gas based on a reducing agent containing hydrogen and a mixture of at least an oxidizing agent containing oxygen and a reducing agent containing hydrogen can be contacted with the polymer individually or in any combination with one another and in any sequence where more than one is employed in the process of the invention.

Especially preferred plasmas are those based on water, hydrogen and the oxides of nitrogen, especially nitrous oxide ($N_2O$). The polymers that are especially of interest in the process of the present invention comprise the polyimide polymers and the fluorinated polymers such as PTFE polymers and the various equivalents thereof.

After the polymer is contacted with a plasma, the treated polymer thus obtained is contacted with cations of a metal, preferably in solution so that the cations are combined with the treated polymer. The cations that are used in this respect are those based on the Group VIII, IB, IIB, IIIA or IVA metals. The metals employed in this respect that are especially preferred are the Group VIII noble metals i.e. the platinum metals comprising platinum, iridium, osmium, palladium, rhodium and ruthenium (especially palladium) or the Group IB metals and especially gold.

In one embodiment of the invention, it has been discovered that a palladium salt such as palladium nitrate in a water solution can be contacted with a polyimide or a fluorinated polyethylene surface that has been treated with either a nitrous oxide or water plasma. The subsequent application of an aqueous electroless copper solution comprising a copper salt such as copper sulfate dissolved in water wherein said solution also contains an aldehyde reducing agent, will effect the deposit of an electroless copper coating. It is believed that the aldehyde reducing agent reduces the palladium cation to zero valent palladium metal which in turn acts to catalyze the formaldehyde reducing agent in the reduction of the copper salt to copper metal. The palladium is also tightly bound to the polymer and depending on processing conditions will be intermixed with the polymer starting at the surface and extending to a depth beneath the surface.

It has also been found that the treated polymer obtained according to the method of the present invention increases the wettability of these polymer surfaces and results in improved wetting of the treated polymer by water, water solutions of compounds, water dispersions or emulsions. Better plating results are thereby obtained for high aspect ratio vias in polymers. This is especially significant with respect to the fluorinated polymers described herein which are difficult to wet with water.

In thin film packages, where the polymer is 6, 12 or 25 microns thick, a high aspect ratio via would be greater than about one; in circuit cards from about 8 to about 10, the upper limit being about 20. Accordingly by high aspect ratio vias, it is intended to include those falling within the range of greater than about one to about 20 and especially from greater than about one to about 10.

Thus high aspect ratio blind vias can be readily plated when the polymer layer employed in this respect is treated by the process of the invention e.g. exposed to a plasma as described herein followed by plating, especially in the case of polymer layers comprising either polyimides or fluorinated polymers and especially fluorinated polymers.

The following examples are illustrative.

EXAMPLES

Example 1 (YO-8880688)

A nitrous oxide plasma was produced in a "Plasmod" (trademark) plasma generator at 100W Rf, 1–5 SCCM nitrous oxide and 120–250 mT pressure and 13.56 MHz. A polyimide was contacted with the plasma for about several minutes for subsequent plating. The polyimide is a condensation product of BTDA-ODA-MPDA which is commercially available from E.I. DuPont DeNemours and Company, Inc. sold under the trademark "Pyralin."

A seeding solution was then prepared comprising 100 mg of palladium nitrate in 100 mL of deionized water. The plasma treated samples were immersed in the seeding solution for 10–15 minutes followed by washing thoroughly with deionized water. The samples were then plated in a standard electroless copper plating bath at 73° C., pH 11.7 containing 2 mL formaldehyde/L. The treated and seeded polyimide substrate was an active catalyst for copper deposition as noted by the formation of a bright copper film after several minutes in the electroless copper plating bath.

The treated polyimide, after contact with palladium nitrate, did not have to be reduced with a $SnCl_2$ reducing agent which is conventional in the preparation of a palladium catalyst for the application of electroless copper.

Example 2 (YO-8890267-Ex. 1)

Four 2.25 inch glass disks were spin coated with $H_2N-CH_2CH_2CH_2Si(OC_2H_5)_3$ followed by the spin coating of a PMDA-ODA polyimide and cured in a 400° C. nitrogen tube furnace. The four samples thus prepared were contacted with a water plasma generated in the apparatus described in the "Brief Description of the Drawing" supra. The initial system pressure was $5\times10^{-8}T$, the samples having been contacted with the plasma for 30 minutes at 50W RF power where a steady state water pressure was developed at $180\pm5$ mT.

The samples were then removed from the plasma apparatus and were seeded with 800mg palladium nitrate in 800mL deionized water for 30 minutes, rinsed with deionized water for 30 minutes followed by electroless plating for 30 minutes in a conventional electroless bath. After the electroless copper was applied the samples were baked at 20 hours at 85° C. in air and electroplated in a standard acidic cupric sulfate electroplating bath at 4 $mA/cm^2$ to 15 microns thickness. The 90° peel strength of the samples at $2.5\times10^{-2}$ mm/sec was $94\pm4$ g/2 mm.

Example 3 (YO 8890267-Ex.2)

Two samples of a BTDA-ODA-MPDA polyimide obtained from E. I. DuPont DeNemours and Co., Inc. were spin coated to a thickness of 0.002 in. on 2 once copper and baked at 225° C. for 30 minutes. The samples were then exposed to a water vapor plasma in accord with the method of Example 2 followed by seeding in a palladium nitrate bath at a concentration of 1 mg palladium nitrate/mL for a period of 25 minutes followed by rinsing in deionized water for 15 minutes. The samples were then plated in a standard room temperature electroless bath and rinsed in flowing deionized water for 15 minutes followed by electroplating at 5–10 mA/sq.cm in a bath described in Example 2, to a thickness of one mil (0.001 inch). The 90° peel of the samples at 0.16 inch/min. was $53\pm11$ g/2 mm.

Example 4 (YO-8880618)

In this example, a nitrous oxide plasma is employed to create oxygen containing functionalities on the surface of a PTFE surface. The plasma generator of Example 1 was employed to generate a nitrous oxide plasma at 100W Rf at 1 SCCM nitrous oxide and 120 mT pressure. The PTFE is contacted with the plasma for a period of 15 minutes and a surface is produced on the polymer that wets well with water and will pick up a palladium seed from an aqueous solution of palladium nitrate. Some surface oxidation improved wettability appears to occur after what appears to be protonation following nitrous oxide plasma treatment. This takes place in the aqueous seeding solution, or may alternately be accomplished in the plasma with the addition of hydrogen gas. In any event, it was observed that a change had occurred in the water contact angle on the PTFE from a value of approximately 100° for the untreated, pre-wet surface to a value of 20° for the plasma modified surface.

After seeding the nitrous oxide plasma modified PTFE surface in an aqueous solution of palladium nitrate, copper plating in an elevated temperature electroless copper plating bath yielded a uniform, shiny, copper coating that survived a Scotch Tape (trademark) peel test.

The foregoing method is especially suitable for the treatment of high aspect ratio via walls in fluorinated polymer layers such as PTFE layers.

Although the invention has been described by reference to some embodiments, it is not intended that the novel process be limited thereby but that modifications are intended to be included as falling within the broad scope and spirit of the foregoing disclosure and the following claims.

Having thus described our invention, what we claim as new, and desire to secure by Letters Patent is:

1. A process for producing a metal-organic polymer combination in which the metal is present in cationic form, comprising contacting said polymer with a plasma to obtain a treated polymer and contacting said treated polymer with a compound containing cations of said metal to obtain said metal-organic polymer combination in which the metal is present in cationic form, and then recovering said combination.

2. The process of claim 1 where said metal-organic polymer combination comprises a coating on the surface of said polymer.

3. The process of claim 2 where said coating extends from the surface of said polymer to a depth beneath the surface of said polymer.

4. The process of claim 1 wherein said plasma comprises:
   (i) an oxidizing gas based on an oxidizing agent containing oxygen;
   (ii) a reducing gas based on a reducing agent containing hydrogen; or
   (iii) a mixture of at least an oxidizing agent containing oxygen and a reducing agent containing hydrogen.

5. The process of claim 2 wherein said plasma comprises:
   (i) an oxidizing gas based on an oxidizing agent containing oxygen;
   (ii) a reducing gas based on a reducing agent containing hydrogen; or (iii) a mixture of at least an oxidizing agent containing oxygen and a reducing agent containing hydrogen.

6. The process of claim 3 wherein said plasma comprises:
   (i) an oxidizing gas based on an oxidizing agent containing oxygen;
   (ii) a reducing gas based on a reducing agent containing hydrogen; or
   (iii) a mixture of at least an oxidizing agent containing oxygen and a reducing agent containing hydrogen.

7. The process of claim 1 wherein said plasma is a gas based on water, a peroxide, oxygen, an oxide of nitrogen, ozone, hydrogen, ammonia, hydrogen sulfide, hydrazines, diborane, metal acetylacetonates, lower alkyl metal complexes or lower n-alkanes.

8. The process of claim 2 wherein said plasma is a gas based on water, a peroxide, oxygen, an oxide of nitrogen, ozone, hydrogen, ammonia, hydrogen sulfide, hydrazines, diborane, metal acetylacetonates, lower alkyl metal complexes or lower n-alkanes.

9. The process of claim 3 wherein said plasma is a gas based on water, a peroxide, oxygen, an oxide of nitrogen, ozone, hydrogen, ammonia, hydrogen sulfide, hydrazines, diborane, metal acetylacetonates, lower alkyl metal complexes or lower n-alkanes.

10. The process of claim 1 where said polymer is a fluorinated polymer or a polyimide.

11. The process of claim 2 where said polymer is a fluorinated polymer or a polyimide.

12. The process of claim 3 where said polymer is a fluorinated polymer or a polyimide.

13. The process of claim 7 where said polymer is a fluorinated polymer or a polyimide.

14. The process of claim 1 wherein said metal and cations of said metal are based on the Group VIII, IB, IIB, IIIA and IVA metals.

15. The process of claim 1 wherein said metal and cations of said metal are based on the Group VIII noble metals or Group IB metals.

16. The process of claim 10 wherein said metal and cations of the metal are based on the Group VIII noble metals or Group IB metals.

17. The process of claim 11 wherein said metal and cations of the metal are based on the Group VIII noble metals or Group IB metals.

18. The process of claim 12 wherein said metal and cations of the metal are based on the Group VIII noble metals or Group IB metals.

19. The process of claim 13 wherein said metal and cations of the metal are based on the Group VIII noble metals or Group IB metals.

20. A process for producing a metal-organic polymer combination in which the metal is present in cationic form, comprising contacting said polymer with a plasma to obtain a treated polymer wherein said polymer is a fluorinated polymer or polyamide and said metal is a catalytic metal for an aqueous electroless plating composition, said plasma being formed by irradiating water vapor or one or more vaporous oxides of nitrogen with electromagnetic radiation, contacting said treated polymer with cations of said metal so that said cations are combined with said treated polymer to obtain said metal-organic polymer combination in which the metal is present in cationic form, and contacting said combination with an aqueous electroless metal plating both to deposit a second metal.

21. The process of claim 20 where said polymer is a fluorinated polymer and said plasma comprises a nitrous oxide plasma.

22. The process of claim 20 where said polymer is a polyimide and said plasma comprises a nitrous oxide plasma.

23. The process of claim 20 where said polymer is a polyimide and said plasma comprises a water vapor plasma.

24. The process of claim 20 where said polymer is a fluorinated polymer and said plasma comprises a water vapor plasma.

25. The process of claim 21 where said catalytic metal is palladium.

26. The process of claim 22 where said catalytic metal is palladium.

27. The process of claim 23 where said catalytic metal is palladium.

28. The process of claim 24 where said metal is palladium.

29. The process of claim 21 where said plasma also contains hydrogen.

30. The process of claim 22 where said plasma also contains hydrogen.

31. The process of claim 25 where said second metal is copper.

32. The process of claim 26 where said second metal is copper.

33. The process of claim 27 where said second metal is copper.

34. The process of claim 28 where said second metal is copper.

35. The process of claim 20 where said polymer is configured as a high aspect ratio via.

* * * * *

UNITED STATES PATENT AND TRADEMARK OFFICE
CERTIFICATE OF CORRECTION

PATENT NO. : 5,340,451
DATED : August 23, 1994
INVENTOR(S) : Leena P. Buchwalter, et al.

It is certified that error appears in the above-indentified patent and that said Letters Patent is hereby corrected as shown below:

Column 12, line 18, Claim 20: "both"

should read --bath--

Signed and Sealed this

Twenty-eight Day of February, 1995

Attest:

BRUCE LEHMAN

Attesting Officer          Commissioner of Patents and Trademarks